United States Patent
Nagata (10) Patent No.: US 10,217,894 B2
(45) Date of Patent: Feb. 26, 2019

(54) METHOD FOR PRODUCING GROUP III NITRIDE SEMICONDUCTOR LIGHT-EMITTING DEVICE

(71) Applicant: TOYODA GOSEI CO., LTD., Kiyosu-shi (JP)

(72) Inventor: Kengo Nagata, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/621,779

(22) Filed: Jun. 13, 2017

(65) Prior Publication Data

US 2017/0373218 A1   Dec. 28, 2017

(30) Foreign Application Priority Data

Jun. 23, 2016   (JP) ................................. 2016-124740

(51) Int. Cl.
| | |
|---|---|
| *H01L 33/00* | (2010.01) |
| *H01L 33/04* | (2010.01) |
| *H01L 33/12* | (2010.01) |
| *H01L 33/22* | (2010.01) |
| *H01L 33/32* | (2010.01) |

(52) U.S. Cl.
CPC ............ *H01L 33/007* (2013.01); *H01L 33/04* (2013.01); *H01L 33/12* (2013.01); *H01L 33/22* (2013.01); *H01L 33/32* (2013.01)

(58) Field of Classification Search
CPC .............................. H01L 33/007; H01L 33/04
See application file for complete search history.

(56) References Cited

U.S. PATENT DOCUMENTS

| | | | |
|---|---|---|---|
| 8,614,454 B2 | 12/2013 | Yokoyama | |
| 2010/0044718 A1* | 2/2010 | Hanser | .................... C30B 25/02 257/76 |
| 2012/0112188 A1* | 5/2012 | Yokoyama | .......... H01L 21/0242 257/51 |

FOREIGN PATENT DOCUMENTS

JP   2012-104564 A   5/2012

* cited by examiner

*Primary Examiner* — Mohammad Choudhury
(74) *Attorney, Agent, or Firm* — McGinn IP Law Group, PLLC (57) ABSTRACT

The present techniques provide a method for producing a Group III nitride semiconductor light-emitting device, which method is intended to grow semiconductor layers with high crystallinity on a sapphire substrate having a small area ratio of a base surface to a main surface. In preparing a substrate, a substrate is prepared, of which a main surface has a c-plane base surface and a plurality of projections protruding from the base surface, and the area ratio of the base surface to the main surface is 8% to 32%. In preparing an AlN buffer layer, the AlN buffer layer having a thickness of 34 nm to 14 nm is formed through MOCVD. The thickness of the AlN buffer layer is decreased as the area ratio of the base surface to the main surface of the substrate is increased.

10 Claims, 3 Drawing Sheets

METHOD FOR PRODUCING GROUP III NITRIDE SEMICONDUCTOR LIGHT-EMITTING DEVICE

BACKGROUND OF THE INVENTION

Field of the Invention

The present techniques relate to a method for producing a Group III nitride semiconductor light-emitting device. More specifically, the present techniques relate to a method for producing a Group III nitride semiconductor light-emitting device using a sapphire substrate having an uneven pattern thereon.

Background Art

A sapphire substrate used for a Group III nitride semiconductor light-emitting device may have a fine uneven pattern formed thereon to efficiently extract the light emitted from the Group III nitride semiconductor light-emitting layer to the outside.

For example, Japanese Patent Application Laid-Open (kokai) No. 2012-104564 discloses a substrate on which conical projections are disposed at equal intervals in a checkerboard pattern (paragraph [0024] and FIG. 3). It describes that the base width d1 of the projection is 0.05 µm to 5 µm, and the interval d2 between the adjacent projections is 0.5 to 5 times the base width d1 (paragraph [0025]). When the interval d2 is 0.5 times the base width d1, the area ratio of the flat base surface, i.e., the area except the projections, to the total main surface of the substrate is approximately 65%. When the interval d2 is 5 times the base width d1, the area ratio of the flat base surface to the total main surface is approximately 98%.

To efficiently extract the light emitted from the light-emitting layer to the outside, the area (area of the projections) ratio of the uneven pattern of the sapphire substrate may be increased. However, when the area ratio of the projections of the sapphire substrate is increased, the area ratio of the flat base surface of the sapphire substrate is reduced. To make a semiconductor layer grow with high crystallinity, the semiconductor layer is grown from the flat base surface of the sapphire substrate. Therefore, when the area ratio of the flat base surface of the sapphire substrate is small, the semiconductor layer with high crystallinity is difficult to grow. For example, when the area ratio of the projections is large, the semiconductor layer is more easily grown from the inclined surfaces of the projections. Therefore, when the semiconductor layer grown from the inclined surfaces of the projections joins the semiconductor layer grown from the flat base surface of the sapphire substrate, the crystallinity of the semiconductor layer may be deteriorated.

SUMMARY OF THE INVENTION

The present techniques have been conceived for solving the aforementioned problems involved in conventional techniques. Thus, an object of the present techniques is to provide a method for producing a Group III nitride semiconductor light-emitting device, which method is intended to grow a semiconductor layer with high crystallinity on a sapphire substrate having a small area ratio of the base surface to the main surface.

In a first aspect of the present techniques, there is provided a method for producing a Group III nitride semiconductor light-emitting device, the method comprising preparing a sapphire substrate, forming an AlN buffer layer on the sapphire substrate, and forming a Group III nitride semiconductor layer on the AlN buffer layer. In the preparing a sapphire substrate, a sapphire substrate is prepared, of which a main surface has a c-plane base surface and a plurality of projections protruding from the base surface, and an area ratio of the base surface to the main surface is 8% to 32%. In the forming an AlN buffer layer, an AlN buffer layer having a thickness in a range of 34 nm to 14 nm is formed through MOCVD, the thickness of the AlN buffer layer is decreased as the area ratio of the base surface to the main surface of the substrate is increased. In the forming a Group III nitride semiconductor layer, an n-type semiconductor layer, a light-emitting layer, and a p-type semiconductor layer are formed in this order on the AlN buffer layer.

In the method for producing the Group III nitride semiconductor light-emitting device, while a sapphire substrate having a small area ratio of the base surface to the main surface is used, a semiconductor layer can be preferably grown from the base surface.

In a second aspect of the present techniques, there is provided a method for producing a Group III nitride semiconductor light-emitting device, the method comprising preparing a sapphire substrate, forming an AlN buffer layer on the sapphire substrate, and forming a Group III nitride semiconductor layer on the AlN buffer layer. In the preparing a sapphire substrate, a sapphire substrate is prepared, of which a main surface has a c-plane base surface and a plurality of projections protruding from the base surface, and an area ratio of the base surface to the main surface is 8% to 32%. In the forming an AlN buffer layer, an AlN buffer layer having a thickness in a range of 57 nm to 37 nm is formed by sputtering, the thickness of the AlN buffer layer is decreased as the area ratio of the base surface to the main surface of the substrate is increased. In the forming a Group III nitride semiconductor layer, an n-type semiconductor layer, a light-emitting layer, and a p-type semiconductor layer are formed in this order on the AlN buffer layer.

A third aspect of the present techniques is drawn to a specific embodiment of the production method according to the first aspect, wherein the thickness of the AlN buffer layer exists within a range of ±6 nm with respect to a ling connecting a first point where the thickness of the buffer layer is 34 nm when the area ratio of the base surface to the main surface of the substrate is 9% and a second point where the thickness of the buffer layer is 14 nm when the area ratio of the base surface to the main surface of the substrate is 31%.

A fourth aspect of the present techniques is drawn to a specific embodiment of the production method according to the first aspect, wherein the thickness of the AlN buffer layer exists within a range of ±6 nm with respect to a ling connecting a first point where the thickness of the buffer layer is 24 nm when the area ratio of the base surface to the main surface of the substrate is 17% and a second point where the thickness of the buffer layer is 17 nm when the area ratio of the base surface to the main surface of the substrate is 25%.

A fifth aspect of the present techniques is drawn to a specific embodiment of the production method according to the second aspect, wherein the thickness of the AlN buffer layer exists within a range of ±6 nm with respect to a ling connecting a first point where the thickness of the buffer layer is 55 nm when the area ratio of the base surface to the main surface of the substrate is 9% and a second point where the thickness of the buffer layer is 38 nm when the area ratio of the base surface to the main surface of the substrate is 31%.

A sixth aspect of the present techniques is drawn to a specific embodiment of the production method according to the second aspect, wherein the thickness of the AlN buffer layer exists within a range of ±6 nm with respect to a ling connecting a first point where the thickness of the buffer layer is 41 nm when the area ratio of the base surface to the main surface of the substrate is 25% and a second point where the thickness of the buffer layer is 38 nm when the area ratio of the base surface to the main surface of the substrate is 31%.

A seventh aspect of the present techniques is drawn to a specific embodiment of the production method according to the first or second aspect, wherein, in the forming an n-type semiconductor layer, an n-type facet layer is formed on the AlN buffer layer on the base surface, and an n-type contact layer is formed on the n-type facet layer. The n-type facet layer is formed at a temperature lower than a temperature for forming the n-type contact layer.

An eighth aspect of the present techniques is drawn to a specific embodiment of the production method according to the second or seventh aspect, wherein, in the forming an n-type facet layer, the Group III nitride semiconductor layer is grown from the base surface in the AlN buffer layer at a growth rate higher than a growth rate for growing the Group III nitride semiconductor layer from the plurality of projections in the AlN buffer layer.

A ninth aspect of the present techniques is drawn to a specific embodiment of the production method according to the seventh or eighth aspect, wherein the n-type facet layer is grown up to a level higher than tops of the projections without covering the tops of the projections, and the n-type contact layer is grown while covering the tops of the projections.

The present techniques, disclosed in the specification, provide method for producing a Group III nitride semiconductor light-emitting device, which method is intended to grow a semiconductor layer with high crystallinity on a sapphire substrate having a small area ratio of the base surface to the main surface.

BRIEF DESCRIPTION OF THE DRAWINGS

Various other objects, features, and many of the attendant advantages of the present techniques will be readily appreciated as the same becomes better understood with reference to the following detailed description of the preferred embodiments when considered in connection with the accompanying drawings, in which.

DETAILED DESCRIPTION OF PREFERRED EMBODIMENTS

With reference to the drawings, specific embodiment of the production method for producing a semiconductor light-emitting device as an example will next be described in detail. However, this embodiment should not be construed as limiting the techniques thereto. The below-described depositing configuration of the layers of the semiconductor light-emitting device and the electrode structure are given only for the illustration purpose, and other depositing structures differing therefrom may also be employed. The thickness ratio of each of the layers shown in the drawings is not an actual value, but a conceptual value.

First Embodiment

1. Semiconductor Light-Emitting Device

Figure 1:
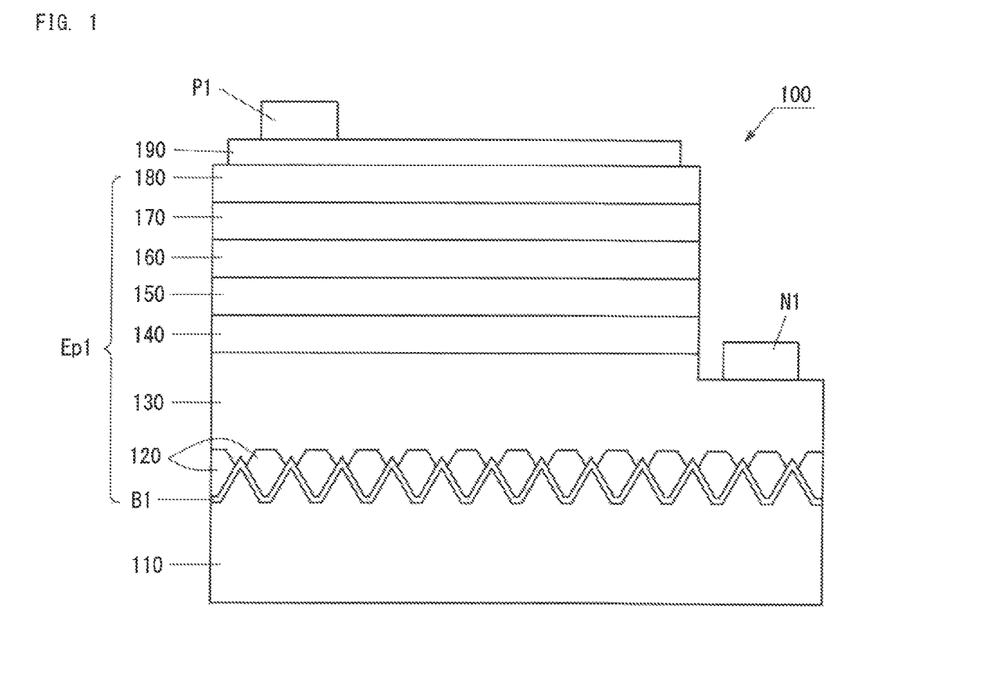
FIG. 1 is a schematic view showing the structure of a light-emitting device according to a first embodiment.

FIG. 1 is a schematic view showing the structure of a light-emitting device 100 according to a first embodiment. The light-emitting device 100 is a face-up type semiconductor light-emitting device. The light-emitting device 100 has a plurality of Group III nitride semiconductor layers.

As shown in FIG. 1, the light-emitting device 100 comprises a substrate 110, an AlN buffer layer B1, an n-type facet layer 120, an n-type contact layer 130, an n-side electrostatic breakdown preventing layer 140, an n-side superlattice layer 150, a light-emitting layer 160, a p-type cladding layer 170, a p-type contact layer 180, a transparent electrode 190, an n-electrode N1, and a p-electrode P1. The AlN buffer layer B1, the n-type facet layer 120, the n-type contact layer 130, the n-side electrostatic breakdown preventing layer 140, the n-side superlattice layer 150, the light-emitting layer 160, the p-type cladding layer 170, and the p-type contact layer 180 constitutes a semiconductor layer Ep1. The n-type facet layer 120, the n-type contact layer 130, the n-side electrostatic breakdown preventing layer 140, and the n-side superlattice layer 150 are an n-type semiconductor layer. The p-type cladding layer 170 and the p-type contact layer 180 are a p-type semiconductor layer. The n-type semiconductor layer may have an ud-GaN layer undoped with a donor. The p-type semiconductor layer may have an ud-GaN layer undoped with an acceptor.

The semiconductor layer Ep1 is formed on the main surface of the substrate 110, in the order of the AlN buffer layer B1, the n-type facet layer 120, the n-type contact layer 130, the n-side electrostatic breakdown preventing layer 140, the n-side superlattice layer 150, the light-emitting layer 160, the p-type cladding layer 170, and the p-type contact layer 180. The n-electrode N1 is formed on the n-type contact layer 130. The p-electrode P1 is formed on the transparent electrode 190.

The substrate 110 is a growth substrate for growing the semiconductor layer Ep1 on the main surface thereof. As described later, an uneven pattern is formed on the main surface of the substrate 110. The substrate 110 is made of sapphire.

The AlN buffer layer B1 is for forming the upper layers while preserving the crystal structure of the substrate 11. Therefore, the AlN buffer layer B1 is formed on the main surface of the substrate 110. The AlN buffer layer B1 is an intermediate layer between the substrate 110 and the n-type semiconductor layer. Needless to say, the AlN buffer layer B1 is made of AlN. The details will be described later.

The n-type facet layer 120 is for growing a semiconductor layer with high crystallinity on the AlN buffer layer B1 having a narrow base surface. Therefore, the n-type facet layer 120 is formed on the base surface of the AlN buffer layer B1.

The n-type contact layer 130 is for obtaining an ohmic contact with the n-electrode N1. The n-type contact layer 130 is formed on the AlN buffer layer B1 and the n-type facet layer 120. The n-electrode N1 is disposed on the n-type contact layer 130. The n-type contact layer 130 is n-type GaN. The Si concentration of the n-type contact layer 130 is $1\times10^{18}/cm^3$ or more. The n-type contact layer 130 may comprise a plurality of layers having different carrier concentrations to improve the ohmic contact properties with the n-electrode N1.

The n-side electrostatic breakdown preventing layer 140 is an electrostatic breakdown preventing layer for preventing electrostatic breakdown of the semiconductor layer Ep1. The n-side electrostatic breakdown preventing layer 140 is formed on the n-type contact layer 130. The n-side electrostatic breakdown preventing layer 140 has an n-type GaN layer. The n-side electrostatic breakdown preventing layer 140 may have an ud-GaN layer, an n-type AlGaN layer, or an ud-AlGaN layer.

The n-side superlattice layer 150 is a strain relaxation layer for relaxing stress applied to the light-emitting layer 160. More specifically, the n-side superlattice layer 150 is a superlattice layer having a superlattice structure. The n-side superlattice layer 150 is formed on the n-side electrostatic breakdown preventing layer 140. The n-side superlattice layer 150 is formed by repeatedly depositing an n-type GaN layer and a GaN layer. The n-side superlattice layer 150 may include an InGaN layer.

The light-emitting layer 160 is a layer which emits light through recombination of electrons and holes. The light-emitting layer 160 is formed on the n-side superlattice layer 150. The light-emitting layer 160 is formed by repeatedly depositing layer units, each layer unit comprising a well layer and a barrier layer deposited. Each layer unit of the light-emitting layer 160 may have a capping layer on the well layer.

The p-type cladding layer 170 is formed on the light-emitting layer 160. The p-type cladding layer 170 is formed by repeatedly depositing a p-type InGaN layer and a p-type AlGaN layer. Needless to say, the p-type cladding layer 170 may have other layered structure.

The p-type contact layer 180 is formed on the p-type cladding layer 170. The p-type contact layer 180 is in contact with the transparent electrode 190.

The transparent electrode 190 is formed on the p-type contact layer 180. The transparent electrode 190 is in contact with the p-electrode P1. The transparent electrode 190 may be formed of at least one selected from a group consisting of ITO, IZO, ICO, ZnO, $TiO_2$, $NbTiO_2$, $TaTiO_2$, and $SnO_2$.

The p-electrode P1 is formed on the transparent electrode 190. The p-electrode P1 is formed by forming Ti, Rh, and Au in order on the transparent electrode 190. Needless to say, the p-electrode P1 may have other structure.

The n-electrode N1 is formed on the n-type contact layer 130. The n-electrode N1 is formed by depositing Ti, Rh, and Au in order on the n-type contact layer 130. Needless to say, the n-electrode N1 may have other structure.

The light-emitting device 100 may have a protective film for protecting the semiconductor layer Ep1 and other layers.

2. Substrate Shape

Figure 2:
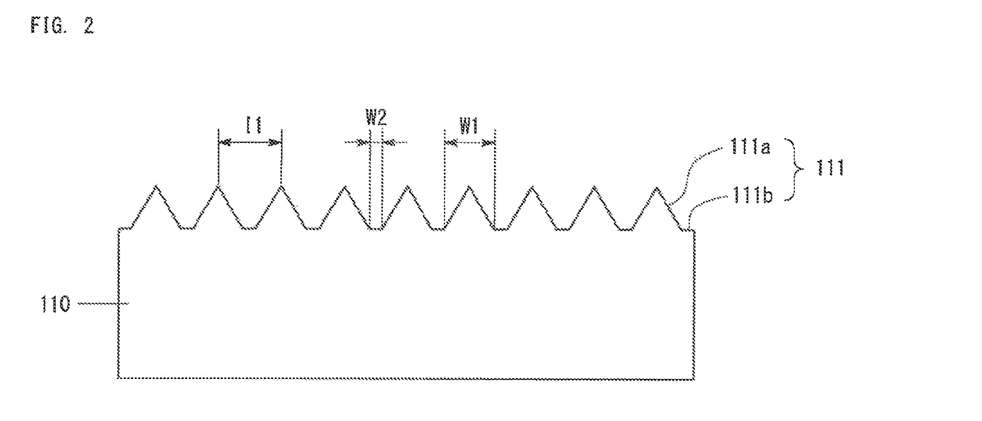
FIG. 2 is a front view showing the shape of a substrate according to the first embodiment.
Figure 3:
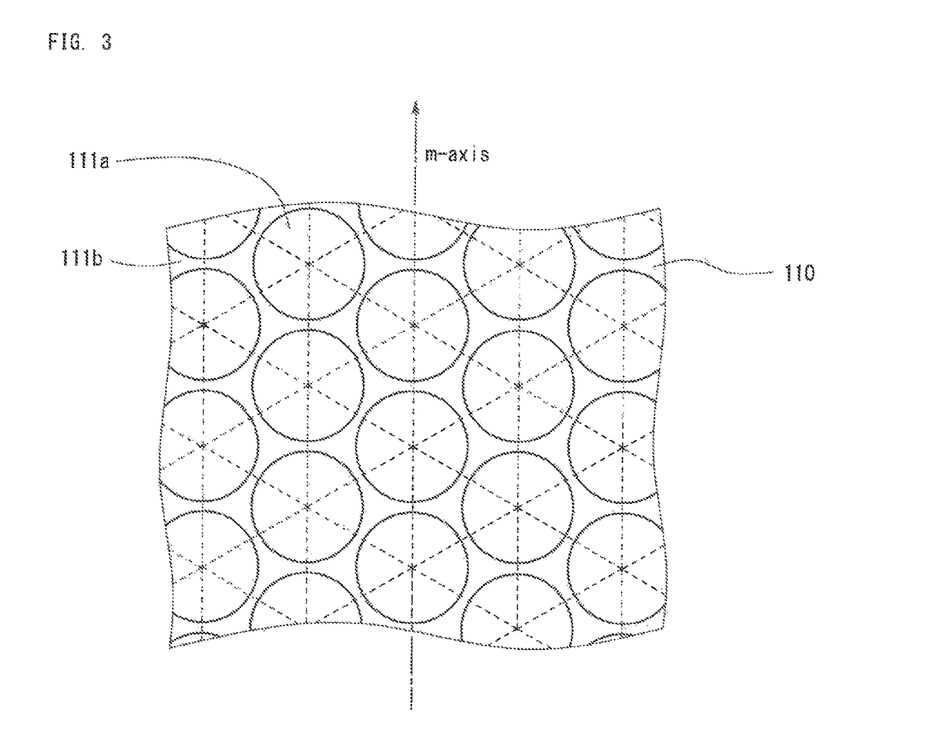
FIG. 3 is a plan view showing the shape of the according to the first embodiment.

FIG. 2 is a front view showing the shape of a substrate 110 according to the first embodiment. FIG. 3 is a plan view showing the shape of the substrate 110 according to the first embodiment. The substrate 110 has a main surface 111. The main surface 111 is a surface on which a semiconductor layer Ep1 is grown. The main surface 111 of the substrate 110 has a plurality of projections 111a and a flat base surface (hereinafter, referred to as base surface) 111b. The plurality of projections 111a is periodically arranged in a honeycomb pattern. The plurality of projections 111a has a conical shape. Therefore, a flat surface, i.e., an area except the projections, of the substrate 110 is the base surface 111b. The base surface 111b is a c-plane of the sapphire substrate. The plurality of projections 111a projects with respect to the base surface 111b of the substrate 110.

The area of the main surface 111 of the substrate 110 is the total areas of bottom surfaces of the plurality of projections 111a and the base surface 111b. The area ratio of the base surface 111b to the main surface 111 of the substrate 110 is 8% to 32%. Since the plurality of projections 111a is arranged in a honeycomb pattern, the area ratio of the base surface 111b to the main surface 111 of the substrate 110 can be sufficiently small.

Since the plurality of projections 111a is arranged in a honeycomb pattern, a width W1 at the bottom surface of the plurality of projections 111a is not more than a pitch interval I1 of the plurality of projections 111a. When the width W1 of the plurality of projections 111a is equal to the pitch interval I1 of the plurality of projections 111a, the area ratio of the base surface 111b to the main surface 111 of the substrate 110 is approximately 10%. At this time, a distance W2 between the projections 111a is 0 μm.

The width W1 at the bottom surface of the plurality of projections 111a is 88% of the pitch interval I1 of the plurality of projections 111a (W1=0.88I1), the area ratio of the base surface 111b to the main surface 111 of the substrate 110 is approximately 30%. In this way, in the first embodiment, the pitch interval I1 of the plurality of projections 111a is equal to or slightly larger than the width W1 at the bottom surface of the plurality of projections 111a.

The pitch interval I1 of the plurality of projections 111a is preferably 0.5 μm to 5 μm. A number density of the projection is preferably 0.05 to 4.63/μm². Needless to say, numerical value range other than the above may also be employed.

3. AlN Buffer Layer

The AlN buffer layer B1 of the first embodiment is formed through metalorganic chemical vapor deposition (MOCVD). The thickness of the AlN buffer layer B1 may vary according to the area ratio of the base surface 111b to the main surface 111 of the substrate 110. In case of employing MOCVD, when the area ratio of the base surface 111b to the main surface 111 of the substrate 110 is 8%, the thickness of the AlN buffer layer B1 is 34 nm. When the area ratio of the base surface 111b to the main surface 111 of the substrate 110 is 32%, the thickness of the AlN buffer layer B1 is 14 nm. Therefore, when the area ratio of the base surface 111b to the main surface 111 of the substrate 110 is 8% to 32%, the thickness of the AlN buffer layer B1 is preferably 34 nm to 14 nm. Moreover, when the area ratio of the base surface 111b to the main surface 111 of the substrate 110 is 8%, the thickness of the AlN buffer layer B1 is 34 nm. When the area ratio of the base surface 111b to the main surface 111 of the substrate 110 is 26%, the thickness of the AlN buffer layer B1 is 16 nm. Therefore, when the area ratio of the base surface 111b to the main surface 111 of the substrate 110 is 8% to 26%, the thickness of the AlN buffer layer B1 is preferably 34 nm to 16 nm.

4. N-Type Facet Layer and N-Type Contact Layer 4-1. N-Type Facet Layer

The n-type facet layer 120 covers the base surface and root parts of the inclined surfaces of the AlN buffer layer B1. However, the n-type facet layer 120 does not cover the vicinity of the tops of the AlN buffer layer B1. The n-type facet layer 120 is a semiconductor layer grown in a vertical direction perpendicular to the main surface of the substrate. A facet surface is exposed on the surface of the n-type facet layer 120. Flat surfaces at the tops of the n-type facet layer 120 are a c-plane. Other facet surface is, for example, a (10-11) plane or a (11-22) plane. The Si concentration of the n-type facet layer 120 is $1 \times 10^{18}$ cm$^{-3}$ to $3 \times 10^{19}$ cm$^{-3}$. The thickness of the n-type facet layer 120 is 100 nm to 3,000 nm. Hereinafter, the thickness of the n-type facet layer 120 refers to a distance from the bottom surface of the n-type facet layer 120 to the flat surface at the top of the n-type facet layer 120. The thickness of the n-type facet layer 120 is larger than the height of the plurality of projections 111a of the substrate 110. The n-type facet layer 120 is formed through MOCVD. As described later, the growth temperature of the n-type facet layer 120 is lower than the growth temperature of the n-type contact layer 130.

4-2. N-Type Contact Layer

The n-type contact layer 130 is a semiconductor layer grown in a lateral direction parallel to the main surface of the substrate on the flat surfaces of the n-type facet layer 120. The exposed tops of the AlN buffer layer B1 are buried in the n-type contact layer 130. The n-type contact layer 130 is formed through MOCVD.

5. Method for Producing Semiconductor Light-Emitting Device

Next will be described the method for producing a light-emitting device 100 according to the first embodiment. The production method includes preparing a substrate 110, forming an AlN buffer layer B1 on the substrate 110, and forming a Group III nitride semiconductor layer on the AlN buffer layer B1. In forming a Group III nitride semiconductor layer, an n-type semiconductor layer, a light-emitting layer 160, and a p-type semiconductor layer are formed in this order on the AlN buffer layer B1.

5-1. Preparing Substrate

Firstly, a substrate 110 is prepared. Here, a substrate 110 may be produced by forming a plurality of projections 111a on the substrate. In this case, a photoresist mask pattern is formed on the substrate, and dry etching is performed using a chlorine based gas. Thus, the substrate 110 having the plurality of projections 111a is produced. Alternatively, a substrate 110 having a plurality of projections 111a formed thereon may be purchased. As described above, the area ratio of the base surface 111b to the main surface 111 of the substrate 110 is 8% to 32%.

5-2. Forming AlN Buffer Layer

Subsequently, an AlN buffer layer B1 is formed on the main surface 111 of the substrate 110. At that time, the AlN buffer layer B1 is formed through metalorganic chemical vapor deposition (MOCVD). The carrier gas employed in the method is hydrogen gas (H$_2$), nitrogen gas (N$_2$), or a mixture of hydrogen gas and nitrogen gas (H$_2$+N$_2$). Ammonia gas (NH$_3$) is used as a nitrogen source. Trimethylaluminum (Al(CH$_3$)$_3$) is used as an aluminum source.

In the following MOCVD, trimethylgallium (Ga(CH$_3$)$_3$) is used as a gallium source. Trimethylindium (In(CH$_3$)$_3$) is used as an indium source. Silane (SiH$_4$) is used as an n-type dopant gas, and bis(cyclopentadienyl)magnesium (Mg(C$_5$H$_5$)$_2$) is used as a p-type dopant gas. Or other gases may be used.

In this way, the AlN buffer layer B1 is formed through MOCVD so as to have a thickness of 14 nm to 34 nm. The substrate temperature in this process is 350° C. to 800° C., and preferably, 350° C. to 500° C.

5-3. Forming N-Type Facet Layer

Next, the n-type facet layer 120 is formed on the AlN buffer layer B1. At that time, the n-type facet layer 120 is grown on the base surface of the AlN buffer layer B1. However, the n-type facet layer 120 is hardly grown on the inclined surfaces of the AlN buffer layer B1 because the thickness of the AlN buffer layer B1 is appropriate. That is, the AlN buffer layer B1 on a c-plane of the substrate 110 is in a condition of easily growing a semiconductor layer. On the other hand, the AlN buffer layer B1 on the plurality of projections 111a of the substrate 110 is not in a condition of easily growing a semiconductor layer.

The growth rate of semiconductor layer on the AlN buffer layer B1 on the c-plane of the substrate 110 is 50 nm/min to 100 nm/min. The growth rate of semiconductor layer on the AlN buffer layer B1 on the plurality of projections 111a of the substrate 110 is 1 nm/min to 30 nm/min. Therefore, the growth rate of Group III nitride semiconductor layer on the base surface 111b in the AlN buffer layer B1 is higher than the growth rate of Group III nitride semiconductor layer on the plurality of projections 111a in the AlN buffer layer B1.

Therefore, a semiconductor layer is grown in a vertical direction on the AlN buffer layer B1 on the base surface 111b of the substrate 110. A c-plane is exposed on the tops of the n-type facet layer 120. A (10-11) plane or a (11-22) plane is exposed on the inclined surfaces of the n-type facet layer 120. At this stage, the AlN buffer layer B1 in the vicinity of the tops of the plurality of projections 111a of the substrate 110 is exposed.

The substrate temperature in this process is 980° C. to 1,080° C. The n-type facet layer 120 is doped with Si at a concentration of $1 \times 10^{18}$ cm$^{-3}$ to $5 \times 10^{19}$ cm$^{-3}$.

5-4. Forming N-Type Contact Layer

An n-type contact layer 130 is formed on the n-type facet layer 120. The n-type contact layer 130 is grown in a lateral direction on the flat surfaces of the tops of the n-type facet layer 120. Therefore, the AlN buffer layer B1 on the plurality of projections 111a of the substrate 110 is buried in the n-type contact layer 130. The substrate temperature in this process is 1,080° C. to 1,300° C. The n-type contact layer 130 is formed at a temperature higher than the temperature for forming the n-type facet layer 120. The n-type contact layer 130 is doped with Si at a concentration of $1 \times 10^{18}$ cm$^{-3}$ to $3 \times 10^{19}$ cm$^{-3}$. When the n-type contact layer 130 is doped with Si at a concentration exceeding $3 \times 10^{19}$ cm$^{-3}$, pits occur, and the total radiant flux Po may be deteriorated.

5-5. Forming N-Side Electrostatic Breakdown Preventing Layer

Subsequently, an n-side electrostatic breakdown preventing layer 140 is formed on the n-type contact layer 130. The substrate temperature in this process is within a range of 750° C. to 950° C.

5-6. Forming N-Side Superlattice Layer

Then, an n-side superlattice layer 150 is formed on the n-side electrostatic breakdown preventing layer 140. Layer units, each including an n-type GaN layer, are repeatedly deposited.

5-7. Forming Light-Emitting Layer

Subsequently, a light-emitting layer 160 is formed on the n-side superlattice layer 150. In this step, the well layer and the barrier layer are repeatedly deposited. The substrate temperature at the growth of the well layer is adjusted to a range of 730° C. to 850° C.

5-8. Forming P-Type Cladding Layer

Then, a p-type cladding layer 170 is formed on the light-emitting layer 160. In this step, for example, the p-type InGaN layer and the p-type AlGaN layer are repeatedly deposited.

5-9. Forming P-Type Contact Layer

Subsequently, a p-type contact layer 180 is formed on the p-type cladding layer 170. The substrate temperature is adjusted to a range of 900° C. to 1,050° C.

5-10. Forming Transparent Electrode

Next, a transparent electrode 190 is formed on the p-type contact layer 180.

5-11. Forming Electrode

Figure 4:
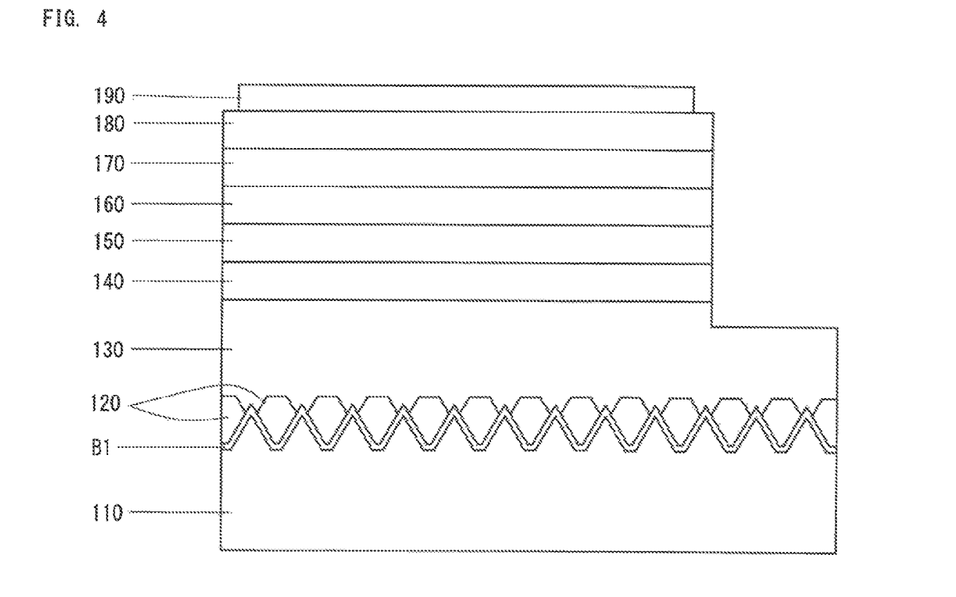
FIG. 4 is a view for describing a method for producing the light-emitting device according to the first embodiment.

Subsequently, as shown in FIG. 4, the semiconductor layers are partially removed through laser radiation or etching from the p-type contact layer 180 side, to thereby expose the n-type contact layer 130. Then, an n-electrode N1 is formed on the thus-exposed region, and a p-electrode P1 is formed on the transparent electrode 190. Either of the p-electrode P1 formation step and the n-electrode N1 formation step may be performed first.

5-12. Other Steps

In addition to the aforementioned steps, there may be further performed a thermal treatment step, an insulating film formation step, and other steps. Through the above steps, the light-emitting device 100 shown in FIG. 1 is produced.

6. Effect of the First Embodiment

In the first embodiment, even if the substrate 110 has a small area ratio of the base surface 111b to the main surface, semiconductor layers above the AlN buffer layer B1 can be preferably grown by adjusting the formation method and the thickness of the AlN buffer layer B1.

In the first embodiment, semiconductor layers are grown only on the base surface 111b of the substrate 110 and are not grown on the inclined surface of the projection. That is, the semiconductor vertically grown on the base surface 111b covers the inclined surface. Threading dislocations are generated and extended upward from only the base surface 111b having an extremely small area ratio to the main surface. Accordingly, the threading dislocation density is extremely small in the semiconductor layers produced by the production method. Thus, the semiconductor layers have high crystallinity. Since the threading dislocation density is small, the density of pits formed on the upper layers is also small. It is because the pits are grown with the threading dislocation as the starting point.

The formation temperature of the n-type contact layer 130 is higher than the formation temperature of the n-type facet layer 120. Thus, the flatness of the n-type contact layer 130 is improved. The number of pits in the n-type contact layer 130 is also decreased. Thereby, the crystallinity of the n-type contact layer 130 and the upper semiconductor layers thereon is improved.

7. Variation 7-1. Shape of Projections on Substrate

Figure 5:
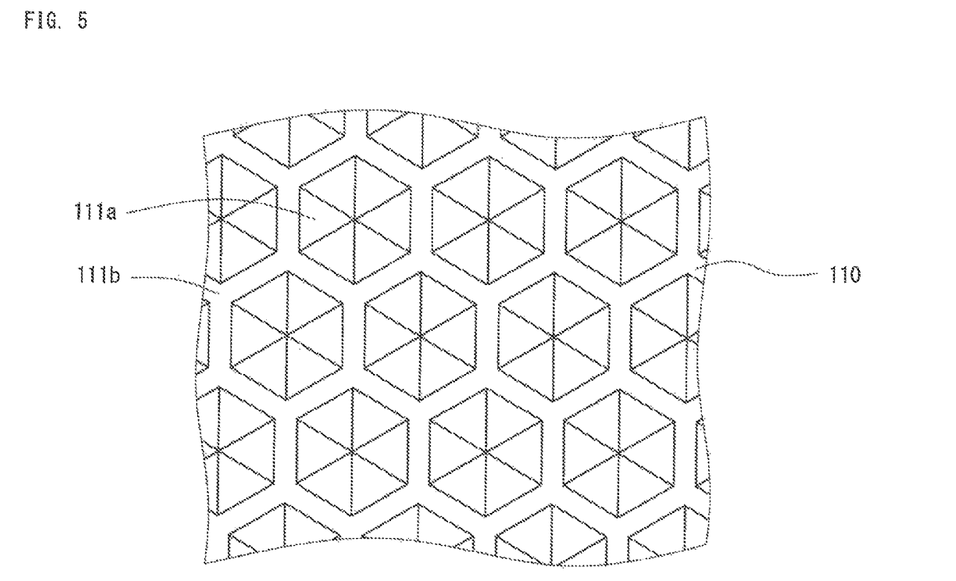
FIG. 5 is a plan view showing the shape of a substrate according to variation of the first embodiment.

On the substrate 110 according to the first embodiment, the plurality of projections 111a has a conical shape. As shown in FIG. 5, the plurality of projections 111a may have a hexagonal pyramidal shape. Or the plurality of projections 111a may have a polygonal pyramidal shape, a truncated cone shape or a truncated polygonal pyramidal shape. It is preferable that the lines connecting the adjacent projections are parallel to the m-axis 7-2. Arrangement of Projections on Substrate On the substrate 110 according to the first embodiment, the plurality of projections 111a is arranged in a honeycomb pattern. The plurality of projections 111a may be arranged in other pattern. For example, when the plurality of projections 111a has a triangular pyramidal shape, the area ratio of the base surface 111b to the main surface of the substrate may be small even if the projections are not arranged in a honeycomb pattern.

7-3. N-Type Facet Layer

The n-type facet layer 120 is an n-type semiconductor layer doped with Si. However, an undoped facet layer may be applied instead of the n-type facet layer 120. The resistivity of the facet layer is reduced by doping Si. Therefore, the n-type facet layer 120 is preferably used.

7-4. Flip-Chip

The light-emitting device 100 according to the first embodiment is a face-up type light-emitting device. However, the present techniques may also be applied to a flip-chip type light-emitting device.

8. Summary of the First Embodiment

As described in details above, in the method for producing the light-emitting device 100 according to the first embodiment, a substrate 110 having a small area ratio of the base surface 111b to the main surface thereof is used. In this case, when the AlN buffer layer B1 is formed through MOCVD, the thickness is adjusted to 14 nm to 34 nm. When the thickness of the AlN buffer layer B1 formed through MOCVD is within the above range, the n-type facet layer 120 is preferably grown. That is, the growth of semiconductor layer is suppressed from the AlN buffer layer B1 on the plurality of projections 111a side. A semiconductor layer with high crystallinity is grown from the AlN buffer layer B1 on the base surface 111b side. The n-type contact layer 130 is laterally grown from the tops of the n-type facet layer 120. Thereby, the n-type contact layer 130 with small threading dislocation density and high crystallinity can be formed. The upper semiconductor layers above the n-type contact layer 130 also have good crystallinity.

Notably, the aforementioned embodiments are given for the illustration purpose. Thus, needless to say, various modifications and variations can be made, so long as they fall within the scope of the present technique. No particular limitation is imposed on the depositing structure of the layered product, and any depositing structure other than those described above may be employed. For example, the depositing structure and the number of repetitions of semiconductor layer units, etc. may be chosen without any limitation. The film formation technique is not limited to metal-organic chemical vapor deposition (MOCVD). Other similar techniques may be employed, so long as they employ carrier gas in crystal growth. Alternatively, the semiconductor layers may be formed through another epitaxial growth technique such as liquid phase epitaxy or molecular beam epitaxy. However, the AlN buffer layer B1 is formed through MOCVD.

Second Embodiment

Second embodiment will be described. The second embodiment is different from the first embodiment in the formation method and thickness of the AlN buffer layer B1. Therefore, only the difference will be described.

1. Formation Method and Thickness of AlN Buffer Layer

The AlN buffer layer B1 of the second embodiment is formed by sputtering. In sputtering, when the area ratio of the base surface 111b to the main surface 111 of the substrate 110 is 8%, the thickness of the AlN buffer layer B1 is 57 nm. When the area ratio of the base surface 111b to the main surface 111 of the substrate 110 is 32%, the thickness of the AlN buffer layer B1 is 37 nm. Therefore, when the area ratio of the base surface 111b to the main surface 111 of the substrate 110 is 8% to 32%, the thickness of the AlN buffer layer B1 is preferably 57 nm to 37 nm. Moreover, when the area ratio of the base surface 111b to the main surface 111 of the substrate 110 is 8%, the thickness of the AlN buffer layer B1 is 57 nm. When the area ratio of the base surface 111b to the main surface 111 of the substrate 110 is 26%, the thickness of the AlN buffer layer B1 is 40 nm. Therefore, when the area ratio of the base surface 111b to the main surface 111 of the substrate 110 is 8% to 26%, the thickness of the AlN buffer layer B1 is preferably 57 nm to 40 nm.

2. Production Method for Semiconductor Light-Emitting Device

The AlN buffer layer formation step different from that of the first embodiment will be described.

2-1. Forming AlN Buffer Layer

Firstly, an AlN buffer layer B1 is formed on a main surface 111 of a substrate 110. In this case, the AlN buffer layer B1 is formed by sputtering. Thus, the AlN buffer layer B1 is formed so as to have a thickness of 37 nm to 57 nm. The substrate temperature in this process is 350° C. to 1,000° C.

3. Effect of the Second Embodiment

In the second embodiment, even if the substrate 110 has a small area ratio of the base surface 111b to the main surface 111, upper semiconductor layers above the AlN buffer layer B1 can be preferably grown by adjusting the formation method and the thickness.

The thickness of the AlN buffer layer B1 is different between the first embodiment and the second embodiment. The reason is as follows. The AlN buffer layer B1 can be generally formed in a polycrystal with higher crystallinity by sputtering than through MOCVD. Therefore, the ratio of lattice mismatch relaxed in case of the same thickness, is higher in MOCVD than in sputtering. That is, when sputtering is employed, a larger thickness is necessary compared to when MOCVD is employed.

In both the first embodiment and the second embodiment, the AlN buffer layer B1 on the base surface 111b is in a condition of promoting the growth of semiconductor layer, and the AlN buffer layer B1 on the inclined surfaces of the plurality of projections 111a is in a condition of suppressing the growth of semiconductor layer. The thickness satisfying such a relationship of the promoting and suppressing between the AlN buffer layer B1 on the base surface 111b and the AlN buffer layer B1 on the plurality of projections 111a, is considered different between when sputtering is employed and when MOCVD is employed.

Example

1. Substrate

In the experiment, the following sapphire substrates were used. A plurality of projections having a conical shape is arranged in a honeycomb pattern. The off-angle of the main surface of the substrate is 0.3° with respect to the c-plane. As shown in FIG. 3, the lines connecting the adjacent projections are parallel to the m-axis. For the AlN buffer layer formed through MOCVD, the area ratio of the base surface to the main surface of the substrate is 9%, 17%, 25%, 31%, 36%, 56%, and 72%. When the AlN buffer layer formed by sputtering is used, the area ratio of the base surface to the main surface of the substrate is 9%, 25%, and 31%.

2. Results

Figure 6:
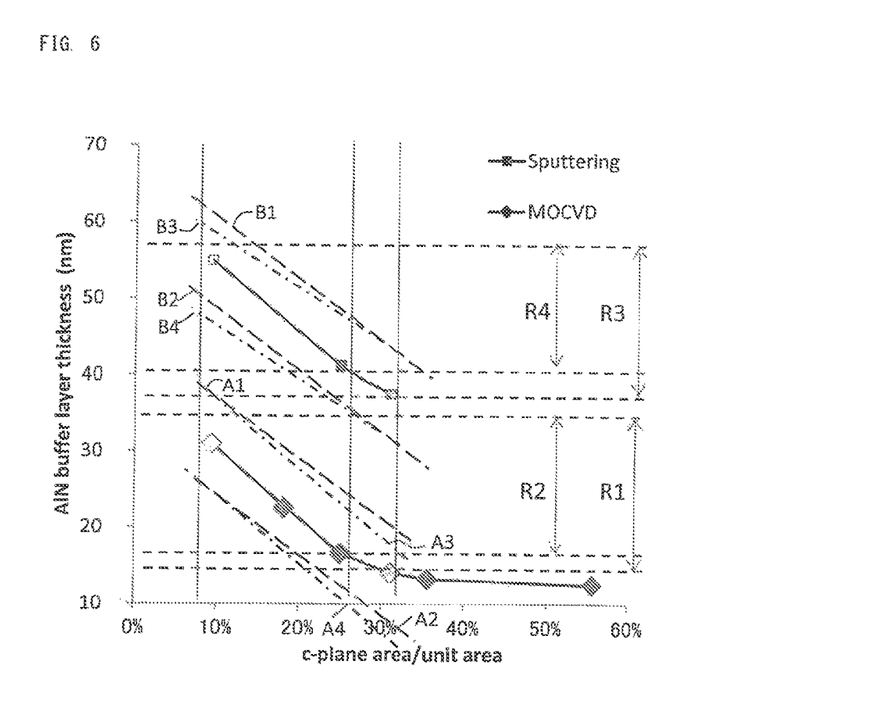
FIG. 6 is a graph showing the relationship between the area ratio of the base surface to the main surface and the AlN buffer layer thickness in a semiconductor layer with high crystallinity by X-ray diffraction.

FIG. 6 is a graph showing the relationship between the area ratio of the base surface to the main surface of the substrate and the thickness of the AlN buffer layer. FIG. 6 shows the preferable thicknesses of the AlN buffer layer determined by X-ray diffraction. The crystallinity of the semiconductor layers grown on the buffer layer was measured by X-ray diffraction with varying the thickness of the AlN buffer layer at a certain area ratio of the base surface to the main surface of the substrate. The thickness of the buffer layer was determined as optimum when a full width at half maximum is the smallest.

The area ratio of 9% is the theoretical lowest limit value. The optimum thickness of the buffer layer at such area ratio is obtained by extrapolating the characteristic between the area ratio of the base surface to the main surface and the optimum thickness of the buffer layer.

As can be seen from FIG. 6, when the AlN buffer layer was formed through MOCVD, the optimum thickness of the buffer layer is 31 nm, 24 nm, 17 nm, 14 nm, 13 nm, 12 nm, and 8 nm respectively at the area ratio of 9%, 17%, 25%, 31%, 36%, 56%, and 72%. When the AlN buffer layer was formed by sputtering, the optimum thickness of the buffer layer is 55 nm, 41 nm, and 38 nm respectively at the area ratio of 9%, 25%, and 31%.

When the area ratio of the base surface to the main surface is smaller than 31%, approximately 30%, the crystallinity of the semiconductor layers is improved by increasing the thickness of the A1 buffer layer as the area ratio is decreased. That is, semiconductor layers with less pits and high flatness are formed.

3. Area Ratio of Base Surface to Main Surface of Substrate

The smaller the area ratio of the base surface to the main surface, the larger the area ratio of the plurality of projections to the main surface. Light is reflected at an interface between the semiconductor layer and the substrate. Therefore, the larger the area ratio of the plurality of projections to the main surface, the higher the light extraction efficiency.

Thus, when a substrate having a small area ratio of the base surface of the substrate is employed, the AlN buffer layer is preferably grown so as to have a larger thickness than the conventional thickness.

As shown in FIG. 6, in case of MOCVD, when the area ratio of the base surface 111b to the main surface 111 of the substrate 110 is 8% to 32%, the thickness of the AlN buffer layer B1 is preferably 34 nm to 14 nm (Region R1 of FIG. 6). When the area ratio of the base surface 111b to the main surface 111 of the substrate 110 is 8% to 26%, the thickness of the AlN buffer layer B1 is preferably 34 nm to 16 nm (Region R2 of FIG. 6).

When the buffer layer is formed through MOCVD, the relationship between the area ratio of the base surface to the main surface of the substrate and the thickness of the buffer layer is preferably set in the following range. In FIG. 6, a line A1 where the thickness of the buffer layer is larger by 6 nm and a line A2 where the thickness of the buffer layer is smaller by 6 nm are drawn with respect to a line connecting the first point where the thickness of the buffer layer is 34 nm when the area ratio of the base surface to the main surface of the substrate is 9% and the second point where the thickness of the buffer layer is 14 nm when the area ratio of the base surface to the main surface of the substrate is 31%. When the relationship between the thickness of the buffer layer and the area ratio of the base surface to the main surface of the substrate exists in an area between these both lines A1 and A2, the crystallinity of the semiconductor layers grown on the buffer layer can be improved.

Moreover, in FIG. 6, a line A3 where the thickness of the buffer layer is larger by 6 nm and a line A4 where the thickness of the buffer layer is smaller by 6 nm are drawn with respect to a line connecting the first point where the thickness of the buffer layer is 24 nm when the area ratio of the base surface to the main surface of the substrate is 17% and the second point where the thickness of the buffer layer is 17 nm when the area ratio of the base surface to the main surface of the substrate is 25%. When the relationship between the thickness of the buffer layer and the area ratio of the base surface to the main surface of the substrate exists in an area between by these both lines A3 and A4, the crystallinity of the semiconductor layers grown on the buffer layer can be improved.

As shown in FIG. 6, in case of sputtering, when the area ratio of the base surface 111b to the main surface 111 of the substrate 110 is 8% to 32%, the thickness of the AlN buffer layer B1 is preferably 57 nm to 37 nm (Region R3 of FIG. 6). When the area ratio of the base surface 111b to the main surface 111 of the substrate 110 is 8% to 26%, the thickness of the AlN buffer layer B1 is preferably 57 nm to 40 nm (Region R4 of FIG. 6).

When the buffer layer is formed by sputtering, the relationship between the thickness of the buffer layer and the area ratio of the base surface to the main surface of the substrate is preferably set in the following range. In FIG. 6, a line B1 where the thickness of the buffer layer is larger by 6 nm and a line B2 where the thickness of the buffer layer is smaller by 6 nm are drawn with respect to a line connecting the first point where the thickness of the buffer layer is 55 nm when the area ratio of the base surface to the main surface of the substrate is 9% and the second point where the thickness of the buffer layer is 38 nm when the area ratio of the base surface to the main surface of the substrate is 31%. When the relationship between the thickness of the buffer layer and the area ratio of the base surface to the main surface of the substrate exists in an area between by these both lines B1 and B2, the crystallinity of the semiconductor layers grown on the buffer layer can be improved.

Moreover, in FIG. 6, a line B3 where the thickness of the buffer layer is larger by 6 nm and a line B4 where the thickness of the buffer layer is smaller by 6 nm are drawn with respect to a line connecting the first point where the thickness of the buffer layer is 41 nm when the area ratio of the base surface to the main surface of the substrate is 25% and the second point where the thickness of the buffer layer is 38 nm when the area ratio of the base surface to the main surface of the substrate is 31%. When the relationship between the thickness of the buffer layer and the area ratio of the base surface to the main surface of the substrate exists in an area between by these both lines B3 and B4, the crystallinity of the semiconductor layers grown on the buffer layer can be improved.

What is claimed is:

1. A method for producing a Group III nitride semiconductor light-emitting device, the method comprising:
preparing a sapphire substrate;
forming an AlN buffer layer on the sapphire substrate; and
forming a Group III nitride semiconductor layer on the AlN buffer layer, wherein
in the preparing a sapphire substrate, the sapphire substrate is prepared, of which a main surface has a c-plane base surface and a plurality of projections protruding from the base surface, and an area ratio of the base surface to the main surface is 8% to 32%;
in the forming an AlN buffer layer, an AlN buffer layer having a thickness in a range of 34 nm to 14 nm is formed through MOCVD, the thickness of the AlN buffer layer is decreased as the area ratio of the base surface to the main surface of the substrate is increased,
wherein the thickness of the AlN buffer layer exists within a range of ±6 nm with respect to a line connecting a first point where the thickness of the buffer layer is 34 nm when the area ratio of the base surface to the main surface of the substrate is 9% and a second point where the thickness of the buffer layer is 14 nm when the area ratio of the base surface to the main surface of the substrate is 31%; and
in the forming a Group III nitride semiconductor layer, an n-type semiconductor layer, a light-emitting layer, and a p-type semiconductor layer are formed in this order on the AlN buffer layer.

2. A method for producing a Group III nitride semiconductor light-emitting device, the method comprising:
preparing a sapphire substrate;
forming an AlN buffer layer on the sapphire substrate; and
forming a Group III nitride semiconductor layer on the AlN buffer layer, wherein
in the preparing a sapphire substrate, the sapphire substrate is prepared, of which a main surface has a c-plane base surface and a plurality of projections protruding from the base surface, and an area ratio of the base surface to the main surface is 8% to 32%;
in the forming an AlN buffer layer, an AlN buffer layer having a thickness in a range of 34 nm to 14 nm is formed through MOCVD, the thickness of the AlN buffer layer is decreased as the area ratio of the base surface to the main surface of the substrate is increased,
wherein the thickness of the AlN buffer layer exists within a range of ±6 nm with respect to a line connecting a first point where the thickness of the buffer layer is 24 nm when the area ratio of the base surface to the main surface of the substrate is 17% and a second point where the thickness of the buffer layer is 17 nm when the area ratio of the base surface to the main surface of the substrate is 25%; and
in the forming a Group III nitride semiconductor layer, an n-type semiconductor layer, a light-emitting layer, and a p-type semiconductor layer are formed in this order on the AlN buffer layer.

3. A method for producing a Group III nitride semiconductor light-emitting device, the method comprising:
preparing a sapphire substrate;
forming an AlN buffer layer on the sapphire substrate; and
forming a Group III nitride semiconductor layer on the AlN buffer layer;
in the preparing a sapphire substrate, the sapphire substrate is prepared, of which a main surface has a c-plane base surface and a plurality of projections protruding from the base surface, and an area ratio of the base surface to the main surface is 8% to 32%;
in the forming an AlN buffer layer, an AlN buffer layer having a thickness in a range of 57 nm to 37 nm is formed by sputtering, the thickness of the AlN buffer layer is decreased as the area ratio of the base surface to the main surface of the substrate is increased,
wherein the thickness of the AlN buffer layer exists within a range of ±6 nm with respect to a line connecting a first point where the thickness of the buffer layer is 55 nm when the area ratio of the base surface to the main surface of the substrate is 9% and a second point where the thickness of the buffer layer is 38 nm when the area ratio of the base surface to the main surface of the substrate is 31%; and in the forming a Group III nitride semiconductor layer, an n-type semiconductor layer, a light-emitting layer, and a p-type semiconductor layer are formed in this order on the AlN buffer layer.

4. A method for producing a Group III nitride semiconductor light-emitting device, the method comprising:
preparing a sapphire substrate;
forming an AlN buffer layer on the sapphire substrate; and
forming a Group III nitride semiconductor layer on the AlN buffer layer;
in the preparing a sapphire substrate, the sapphire substrate is prepared, of which a main surface has a c-plane base surface and a plurality of projections protruding from the base surface, and an area ratio of the base surface to the main surface is 8% to 32%;
in the forming an AlN buffer layer, an AlN buffer layer having a thickness in a range of 57 nm to 37 nm is formed by sputtering, the thickness of the AlN buffer layer is decreased as the area ratio of the base surface to the main surface of the substrate is increased,
wherein the thickness of the AlN buffer layer exists within a range of ±6 nm with respect to a line connecting a first point where the thickness of the buffer layer is 41 nm when the area ratio of the base surface to the main surface of the substrate is 25% and a second point where the thickness of the buffer layer is 38 nm when the area ratio of the base surface to the main surface of the substrate is 31%; and
in the forming a Group III nitride semiconductor layer, an n-type semiconductor layer, a light-emitting layer, and a p-type semiconductor layer are formed in this order on the AlN buffer layer.

5. The method for producing a Group III nitride semiconductor light-emitting device according to claim 1, wherein
in the forming an n-type semiconductor layer,
an n-type facet layer is formed on the AlN buffer layer on the base surface;
an n-type contact layer is formed on the n-type facet layer; and
the n-type facet layer is formed at a temperature lower than a temperature for forming the n-type contact layer.

6. The method for producing a Group III nitride semiconductor light-emitting device according to claim 3, wherein
in the forming an n-type semiconductor layer,
an n-type facet layer is formed on the AlN buffer layer on the base surface;
an n-type contact layer is formed on the n-type facet layer; and
the n-type facet layer is formed at a temperature lower than a temperature for forming the n-type contact layer.

7. The method for producing a Group III nitride semiconductor light-emitting device according to claim 5, wherein
in the forming an n-type facet layer,
the Group III nitride semiconductor layer is grown from the base surface in the AlN buffer layer at a growth rate higher than a growth rate for growing the Group III nitride semiconductor layer from the plurality of projections in the AlN buffer layer.

8. The method for producing a Group III nitride semiconductor light-emitting device according to claim 6, wherein
in the forming an n-type facet layer,
the Group III nitride semiconductor layer is grown from the base surface in the AlN buffer layer at a growth rate higher than a growth rate for growing the Group III nitride semiconductor layer from the plurality of projections in the AlN buffer layer.

9. The method for producing a Group III nitride semiconductor light-emitting device according to claim 5, wherein the n-type facet layer is grown up to a level higher than tops of the projections without covering the tops of the projections, and the n-type contact layer is grown while covering the tops of the projections.

10. The method for producing a Group III nitride semiconductor light-emitting device according to claim 6, wherein the n-type facet layer is grown up to a level higher than tops of the projections without covering the tops of the projections, and the n-type contact layer is grown while covering the tops of the projections.

* * * * *